(12) United States Patent
Kuno et al.

(10) Patent No.: US 12,211,671 B2
(45) Date of Patent: Jan. 28, 2025

(54) WAFER PLACEMENT TABLE

(71) Applicant: NGK Insulators, Ltd., Nagoya (JP)

(72) Inventors: Tatsuya Kuno, Nagoya (JP); Seiya Inoue, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 117 days.

(21) Appl. No.: 18/171,837

(22) Filed: Feb. 21, 2023

(65) Prior Publication Data

US 2023/0343565 A1    Oct. 26, 2023

(30) Foreign Application Priority Data

Apr. 26, 2022   (JP) .................................. 2022-072511

(51) Int. Cl.
*H01J 37/32*    (2006.01)
*H01L 21/683*   (2006.01)

(52) U.S. Cl.
CPC .... *H01J 37/32724* (2013.01); *H01L 21/6833* (2013.01); *H01J 2237/002* (2013.01); *H01J 2237/007* (2013.01)

(58) Field of Classification Search
CPC .......... H01J 37/32724; H01J 2237/002; H01J 2237/2007; H01L 21/6833; H01L 21/67103; H01L 21/67109; H01L 21/6831; H01L 21/683; H01L 21/68785
USPC ....................................................... 361/234
See application file for complete search history.

(56) References Cited

U.S. PATENT DOCUMENTS

| | | | |
|---|---|---|---|
| 5,883,778 A | 3/1999 | Sherstinsky et al. | |
| 6,072,685 A | 6/2000 | Herchen | |
| 8,142,609 B2* | 3/2012 | Takahashi | H01L 21/67109 |
| | | | 118/728 |
| 9,368,377 B2* | 6/2016 | Tandou | C23C 16/463 |
| 12,063,719 B2* | 8/2024 | Suzuki | H01L 21/6831 |
| 12,080,583 B2* | 9/2024 | Sato | H01L 21/6833 |
| 2015/0077895 A1* | 3/2015 | Jindo | C04B 35/645 |
| | | | 228/121 |
| 2019/0244848 A1 | 8/2019 | Willwerth | |

(Continued)

FOREIGN PATENT DOCUMENTS

| | | |
|---|---|---|
| JP | 2002-517093 A | 6/2002 |
| JP | 3982854 B2 | 9/2007 |
| JP | 2016-072478 A | 5/2016 |

(Continued)

OTHER PUBLICATIONS

Korean Office Action (with English translation) dated Aug. 30, 2024 (Application No. 10-2023-0025270).

(Continued)

*Primary Examiner* — Dharti H Patel
(74) *Attorney, Agent, or Firm* — BURR PATENT LAW, PLLC (57) ABSTRACT

A wafer placement table includes: a ceramic substrate having a wafer placement surface at an upper surface, and incorporating an electrode; a cooling substrate which is bonded to a lower surface of the ceramic substrate, and in which a refrigerant flow path is formed; a power supply terminal connected to the electrode; and a power supply terminal hole vertically penetrating the cooling substrate and storing the power supply terminal. The power supply terminal hole intersects with the refrigerant flow path.

7 Claims, 8 Drawing Sheets

(56) References Cited

U.S. PATENT DOCUMENTS

2020/0286755 A1  9/2020  Ito

FOREIGN PATENT DOCUMENTS

JP    2020-145238 A   9/2020
JP    2021-064661 A   4/2021

OTHER PUBLICATIONS

Japanese Office Action (with English translation) dated Oct. 29, 2024 (Application No. 2022-072511).

* cited by examiner

WAFER PLACEMENT TABLE

BACKGROUND OF THE INVENTION

1. Field of the Invention

The present invention relates to a wafer placement table.

2. Description of the Related Art

In a known conventional wafer placement table, a ceramic substrate incorporating an electrode and a cooling substrate in which a refrigerant flow path is formed are bonded. As such a wafer placement table, PTL 1 discloses a configuration to supply power to an electrode. Specifically, an insulation pipe is disposed in a power supply terminal hole which vertically penetrates a cooling substrate, a power supply terminal is inserted into the insulation pipe, and the power supply terminal is connected to an electrode.

CITATION LIST

Patent Literature

PTL 1: Japanese Unexamined Patent Application Publication No. 2021-64661

SUMMARY OF THE INVENTION

However, the power supply terminal hole has a relatively large diameter in order to dispose the insulation pipe, and also needs to be provided so as to avoid a refrigerant flow path. Thus, at the portion of a wafer, immediately above a terminal hole, heat removal is worse, as compared to other part of the wafer, thus temperature singularity (high temperature spot) may occur at the portion.

The present invention has been devised to solve such a problem, and it is a main object to prevent temperature singularity from occurring at the portion of a wafer, immediately above a power supply terminal hole.

[1] A wafer placement table of the present invention includes: a ceramic substrate having a wafer placement surface at an upper surface, and incorporating an electrode; a cooling substrate which is bonded to a lower surface of the ceramic substrate, and in which a refrigerant flow path is formed; a power supply terminal connected to the electrode; and a power supply terminal hole vertically penetrating the cooling substrate and storing the power supply terminal. The power supply terminal hole intersects with the refrigerant flow path.

In this wafer placement table, the power supply terminal hole intersects with the refrigerant flow path. Thus, the refrigerant flow path does not need to be provided so as to avoid the power supply terminal hole. Therefore, it is possible to prevent temperature singularity from occurring at the portion of a wafer, immediately above the power supply terminal hole.

Note that in the present specification, the present invention may be described using up and down, right and left, and front and back; however up and down, right and left, and front and back merely indicate a relative positional relationship. Thus, when the orientation of the wafer placement table is changed, up and down may change to right and left, or right and left may change to up and down, and such a case is also included in the technical scope of the present invention. The "refrigerant flow path" may be a refrigerant flow path provided inside the cooling substrate, or may be a refrigerant flow path groove provided in the upper surface or the lower surface of the cooling substrate.

[2] In the wafer placement table of the present invention (the wafer placement table according to [1]), electrically insulative liquid may be supplied to the refrigerant flow path. In this way, even when the cooling substrate is electrically conductive, the power supply terminal is insulated from the cooling substrate by electrically insulative liquid.

[3] In the wafer placement table of the present invention (the wafer placement table according to [1] or [2]), in the power supply terminal hole, an insulation pipe may be disposed, which supports the power supply terminal by allowing the power supply terminal to pass through the insulation pipe. In this way, since the power supply terminal is supported by the insulation pipe, the power supply terminal can be prevented from being pressed and damaged by the flow of refrigerant. In addition, the voltage resistance across the cooling substrate and the power supply terminal can be increased.

[4] In the wafer placement table of the present invention (the wafer placement table according to [3]), the upper end of the insulation pipe may be fixed to the ceramic substrate, and the lateral surface of the insulation pipe may have a convex section which is in contact with or disposed close to the inner wall of the power supply terminal hole. In this way, the convex section can regulate the movement of the insulation pipe supporting the power supply terminal with in the power supply terminal hole.

[5] In the wafer placement table of the present invention (the wafer placement table according to any one of [1] to [4]), the cooling substrate may have a single-layered structure. In this way, the cooling substrate does not need to be manufactured by bonding, thus the manufacturing cost for the cooling substrate can be reduced.

[6] In the wafer placement table of the present invention (the wafer placement table according to [5]), the refrigerant flow path may have a refrigerant flow path groove provided in the upper surface or the lower surface of the cooling substrate. For example, when the upper surface of the cooling substrate has a refrigerant flow path groove, the refrigerant flow path is formed by covering the upper surface of the refrigerant flow path groove with the ceramic substrate (or a bonding layer that bonds the ceramic substrate and the cooling substrate). Alternatively, when the lower surface of the cooling substrate has a refrigerant flow path groove, the refrigerant flow path is formed by covering the lower surface of the refrigerant flow path groove with a plate member (for example, an installation plate).

[7] In the wafer placement table of the present invention (the wafer placement table according to any one of [1] to [6]), the refrigerant flow path may include a plurality of lines each provided from one end to the other end in a one-stroke pattern in a plan view, and the power supply terminal hole may be provided in one or more of the plurality of lines.

DETAILED DESCRIPTION OF THE INVENTION

Figure 1:
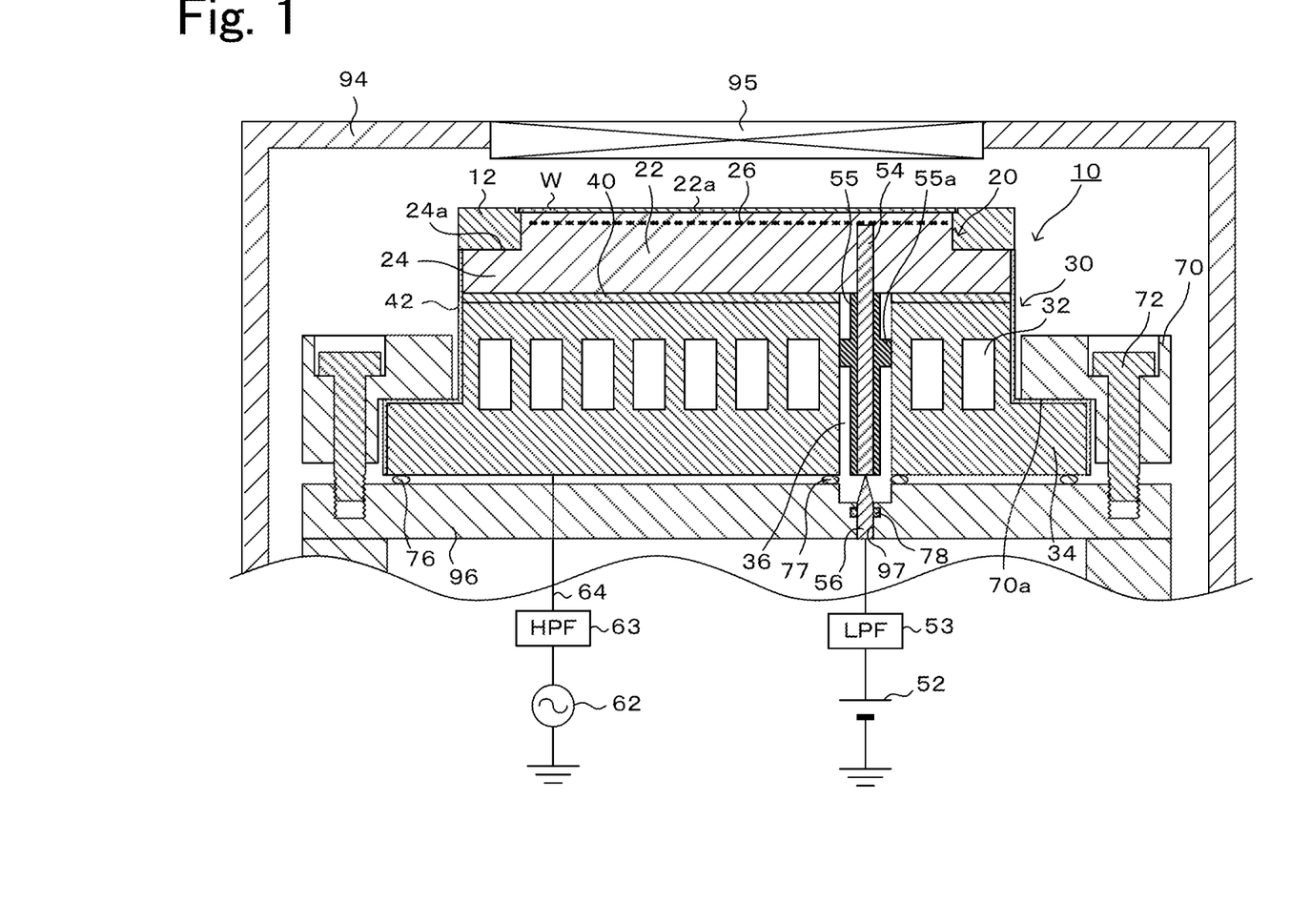
FIG. 1 is a vertical cross-sectional view of a wafer placement table 10 installed in a chamber 94.
Figure 2:
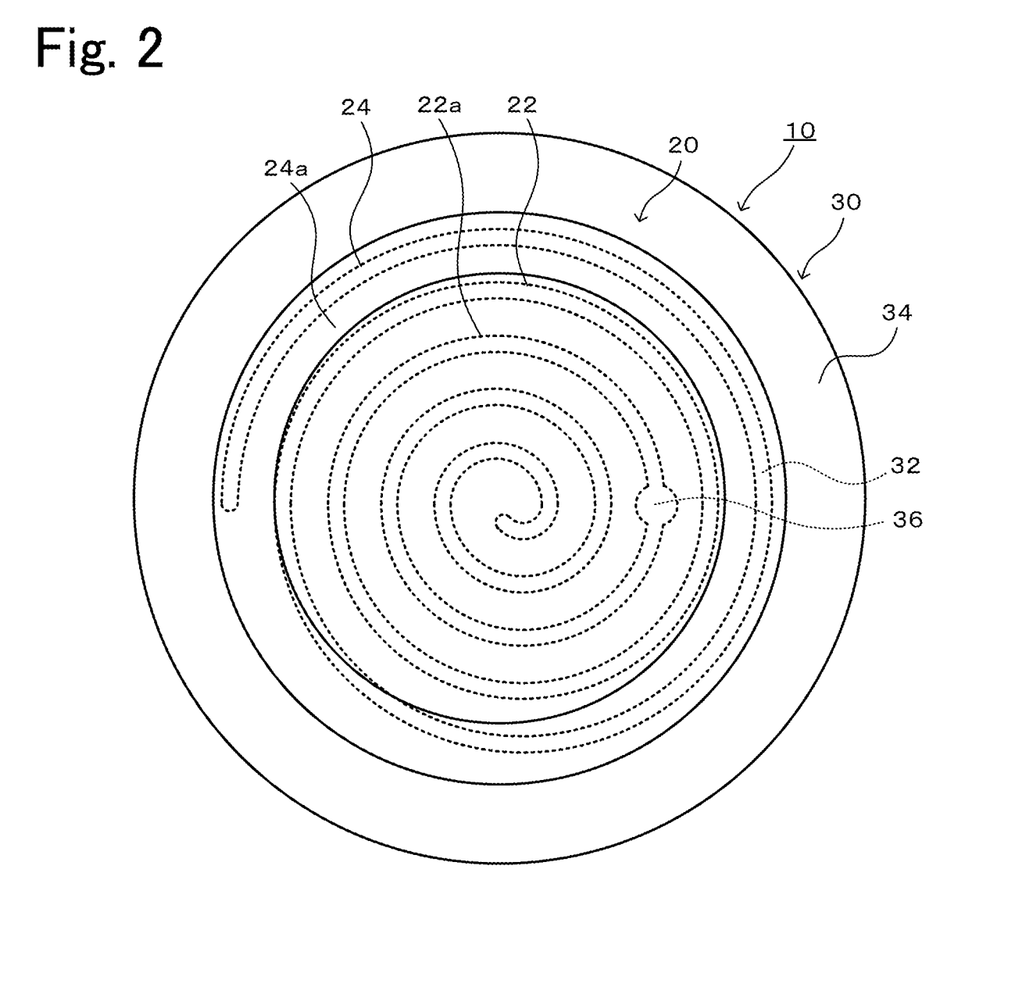
FIG. 2 is a plan view of the wafer placement table 10.
Figure 3:
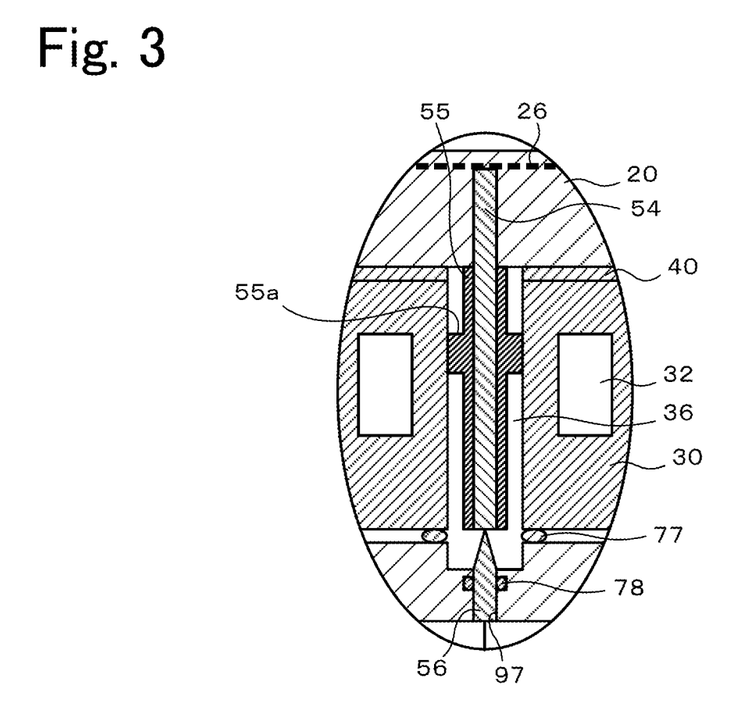
FIG. 3 is an enlarged cross-sectional view illustrating the vicinity of a power supply terminal hole 36.

A preferred embodiment of the present invention will be described below with reference to the accompanying drawings. FIG. 1 is a vertical cross-sectional view (cross-sectional view taken along a plane including the central axis of the wafer placement table 10) of a wafer placement table 10 installed in a chamber 94, FIG. 2 is a plan view of the wafer placement table 10, and FIG. 3 is an enlarged cross-sectional view illustrating the vicinity of a power supply terminal hole 36.

The wafer placement table 10 is used to perform CVD or etching on a wafer W utilizing plasma, and fixed to an installation plate 96 provided inside the chamber 94 for semiconductor process. The wafer placement table 10 includes a ceramic substrate 20, a cooling substrate 30, and a metal bonding layer 40.

The ceramic substrate 20 includes an outer peripheral section 24 having an annular focus ring placement surface 24*a* on the outer periphery of a central section 22 having a circular wafer placement surface 22*a*. Hereinafter the focus ring may be abbreviated as "FR". A wafer W is placed on the wafer placement surface 22*a*, and a focus ring 12 is placed on the FR placement surface 24*a*. The ceramic substrate 20 is composed of a ceramic material represented by alumina, or aluminum nitride. The FR placement surface 24*a* is lower by one step than the wafer placement surface 22*a*.

A wafer attraction electrode 26 is incorporated in the central section 22 of the ceramic substrate 20 at a position close to the wafer placement surface 22*a*. The wafer attraction electrode 26 is composed of a material containing W, Mo, WC or MoC, for example. The wafer attraction electrode 26 is a disk-shaped or mesh-shaped monopole electrostatic attraction electrode. The layer, above the wafer attraction electrode 26, of the ceramic substrate 20 functions as a dielectric layer. A wafer attraction DC power supply 52 is coupled to the wafer attraction electrode 26 via a power supply terminal 54. The power supply terminal 54 is provided from the lower surface of the ceramic substrate 20 to the wafer attraction electrode 26 through an insulation pipe 55 disposed in a through-hole vertically penetrating the cooling substrate 30 and the metal bonding layer 40. A low pass filter (LPF) 53 is provided between the wafer attraction DC power supply 52 and the wafer attraction electrode 26.

The cooling substrate 30 is a disk member composed of a brittle conductive material. The cooling substrate 30 internally includes a refrigerant flow path 32 through which a refrigerant can be circulated. As illustrated in FIG. 2, the refrigerant flow path 32 is provided from one end (inlet) to the other end (outlet) in a one-stroke pattern to cover the entire surface of the ceramic substrate 20 in a plan view. The one end and the other end of the refrigerant flow path 32 are respectively connected to a refrigerant supply path and a refrigerant discharge path which are provided in the installation plate 96 and not illustrated. The refrigerant discharged through the refrigerant discharge path undergoes temperature control, then is returned to the refrigerant supply path again. The refrigerant flowing through the refrigerant flow path 32 is preferably liquid, and preferably has an electrical insulating property. As an electrically insulative liquid, for example, a fluorine-based inert liquid may be mentioned. As a brittle conductive material, a composite material of metal and ceramic may be mentioned. As a composite material of metal and ceramic, a metal matrix composite (MMC) and a ceramic matrix composite (CMC) may be mentioned. Specific examples of such a composite material include a material containing Si, SiC and Ti, a material obtained by impregnating SiC porous body with Al and/or Si, and a composite material of $Al_2O_3$ and TiC. A material containing Si, SiC and Ti is called SiSiCTi, a material obtained by impregnating SiC porous body with Al is called AlSiC, and a material obtained by impregnating SiC porous body with Si is called SiSiC. As the conductive material used for the cooling substrate 30, AlSiC and SiSiCTi having a thermal expansion coefficient closer to that of alumina are preferable. The cooling substrate 30 is coupled to an RF power supply 62 via a power supply terminal 64. A high pass filter (HPF) 63 is disposed between the cooling substrate 30 and the RF power supply 62. The cooling substrate 30 has a flange 34 near its lower surface. The flange 34 is used to clamp the wafer placement table 10 to the installation plate 96.

The cooling substrate 30 is provided with the power supply terminal hole 36. The power supply terminal hole 36 penetrates the cooling substrate 30 vertically, and intersects with the refrigerant flow path 32. The power supply terminal hole 36 stores the power supply terminal 54 for applying a voltage to the wafer attraction electrode 26. The power supply terminal 54 is a rod-shaped member extending vertically. The upper end of the power supply terminal 54 is bonded to the lower surface of the wafer attraction electrode 26. The lower end of the power supply terminal 54 reaches the lower opening of the power supply terminal hole 36, and is in contact with the cone-shaped upper end of a power supply rod 56 provided in the chamber 94. The power supply rod 56 is urged from a lower position to an upper position by a spring which is not illustrated. Thus, the upper end of the power supply rod 56 is in elastic contact with the lower end of the power supply terminal 54. In the power supply terminal hole 36, the insulation pipe 55 is disposed to support the power supply terminal 54 by allowing the power supply terminal 54 to pass through the insulation pipe 55. The upper end of the insulation pipe 55 is bonded and fixed to the ceramic substrate 20. The lateral surface of the insulation pipe 55 is provided with a convex section 55*a* which is in contact with the inner wall of the power supply terminal hole 36. The convex section 55*a* is provided to project in a radially outward direction. Two convex sections 55*a* may be provided, for example, in a diameter direction, three or more convex sections 55*a* may be provided in a radial manner, or the convex sections 55*a* may be provided in a ring shape on the entire circumference of the insulation pipe 55.

The metal bonding layer 40 bonds the lower surface of the ceramic substrate 20 and the upper surface of the cooling substrate 30. The metal bonding layer 40 may be a layer composed of solder or a metal brazing material, for example. The metal bonding layer 40 is formed by TCB (Thermal compression bonding), for example. TCB is a publicly known method, by which a metal bonding material is inserted between two members to be bonded, and the two members are pressure-bonded in a state of heated to a temperature lower than or equal to the solidus temperature of the metal bonding material. The power supply terminal hole 36 also penetrates the metal bonding layer 40 vertically.

The lateral surface of the outer peripheral section 24 of the ceramic substrate 20, the outer periphery of the metal bonding layer 40 and the lateral surface of the cooling substrate 30 are covered with an insulating film 42. As the insulating film 42, for example, a thermal spray film such as alumina and yttria may be mentioned.

The wafer placement table 10 is mounted on the installation plate 96 provided inside the chamber 94 with seal rings 76, 77 interposed between the wafer placement table 10 and the installation plate 96. The seal rings 76, 77 are made of metal or resin. The seal ring 76 is disposed slightly inward of the outer edge of the cooling substrate 30. The seal ring 77 is disposed to surround the lower opening edge of the power supply terminal hole 36 to prevent the refrigerant from leaking outwardly of the seal ring 77.

The outer peripheral area of the wafer placement table 10 is attached to the installation plate 96 using a clamping member 70. The clamping member 70 is an annular member with a substantially inverted L-shaped cross section, and has an inner peripheral stepped surface 70a. With the inner peripheral stepped surface 70a of the clamping member 70 placed on the flange 34 of the cooling substrate 30 of the wafer placement table 10, bolts 72 are each inserted through the upper surface of the clamping member 70 and screwed into a screw hole provided on the upper surface of the installation plate 96. The bolts 72 are attached to multiple sites (for example, eight sites or 12 sites) provided at regular intervals in the circumferential direction of the clamping member 70. The clamping member 70 and the bolts 72 may be produced with an insulating material, or produced with a conductive material (such as metal).

The power supply rod 56 is inserted from the lower surface of the installation plate 96 into a through-hole 97 of the installation plate 96, provided at a position opposed to the power supply terminal hole 36. The through-hole 97 has a large diameter section at the upper half, and a small diameter section at the lower half. The inner wall of the small diameter section of the through-hole 97 is provided with a ring groove, into which an O-ring 78 is fitted. The O-ring 78 is pressed and deformed in a radial direction by the power supply rod 56 to prevent the refrigerant in the power supply terminal hole 36 from leaking down through the through-hole 97. The one end and the other end of the refrigerant flow path 32 are respectively connected via a seal ring disposed between the cooling substrate 30 and the installation plate 96 to the refrigerant supply path and the refrigerant discharge path which are provided in the installation plate 96 and not illustrated. These seal rings prevent the refrigerant from leaking outward.

Figure 4A:
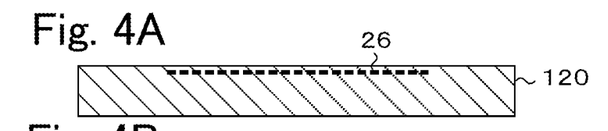
FIGS. 4A to 4G are manufacturing process views of the wafer placement table 10.
Figures 4B, 4C:
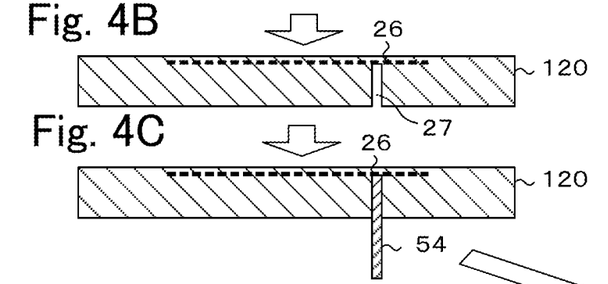

Next, a manufacturing example of the wafer placement table 10 will be described using FIGS. 4A to 4G. FIGS. 4A to 4G are manufacturing process views of the wafer placement table 10. First, a disk-shaped ceramic sintered body 120, from which the ceramic substrate 20 is made, is produced by hot-press firing of a molded body of ceramic powder (FIG. 4A). The wafer attraction electrode 26 is incorporated in the ceramic sintered body 120. Next, a hole 27 is formed from the lower surface of the ceramic sintered body 120 to the wafer attraction electrode 26 (FIG. 4B), and the power supply terminal 54 is inserted into the hole 27 to bond the power supply terminal 54 to the wafer attraction electrode 26 (FIG. 4C).

Figure 4D:
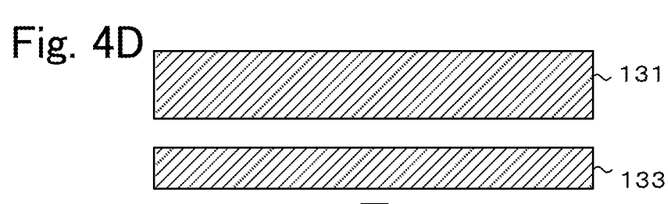
Figure 4E:
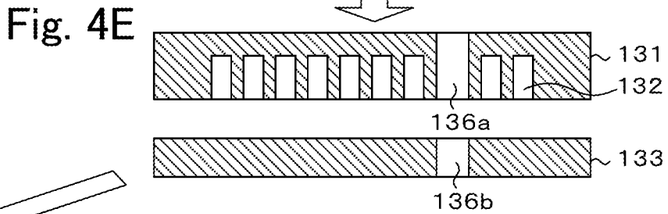

Concurrently, two disk members 131, 133 are produced (FIG. 4D). Then a groove 132, which eventually serves as the refrigerant flow path 32, is formed in the lower surface of the upper disk member 131. A through-hole 136a, which eventually serves as the power supply terminal hole 36, is formed in part of the groove 132. In addition, a through-hole 136b, which eventually serves as the power supply terminal hole 36, is formed in the lower disk member 133. When the ceramic sintered body 120 is made of alumina, the disk members 131, 133 are preferably made of SiSiCTi or AlSiC. This is because the thermal expansion coefficient of alumina is approximately the same as the thermal expansion coefficients of SiSiCTi and AlSiC.

A disk member made of SiSiCTi can be produced as follows, for example. First, silicon carbide, metal Si and metal Ti are mixed to produce a powder mixture. Next, a disk-shaped molded body is produced by applying uniaxial pressure molding to the obtained powder mixture, and hot-press sintering is applied to the molded body in an inert atmosphere to obtain a disk member made of SiSiCTi.

Subsequently, a first metal bonding material is disposed on the upper surface of the lower disk member 133. A vertically penetrating hole is provided at a position of the first metal bonding material, the position being opposed to the through-hole 136b. Next, the upper disk member 131 is disposed on the first metal bonding material, and a second metal bonding material is disposed on the upper surface of the disk member 131. A vertically penetrating hole is provided at a position of the second metal bonding material, the position being opposed to the through-hole 136a. Then the ceramic sintered body 120 is placed on the second metal bonding material while the power supply terminal 54 of the ceramic sintered body 120 is being inserted into the through-holes 136a, 136b of the disk members 131, 133. Thus, a layered body is obtained, in which the disk member 133, the first metal bonding material, the disk member 131, the second metal bonding material and the ceramic sintered body 120 are layered in that order from the bottom. A bonded body 110 is obtained (FIG. 4F) by pressurizing the layered body while heating it (TCB).

Figures 4F, 4G:
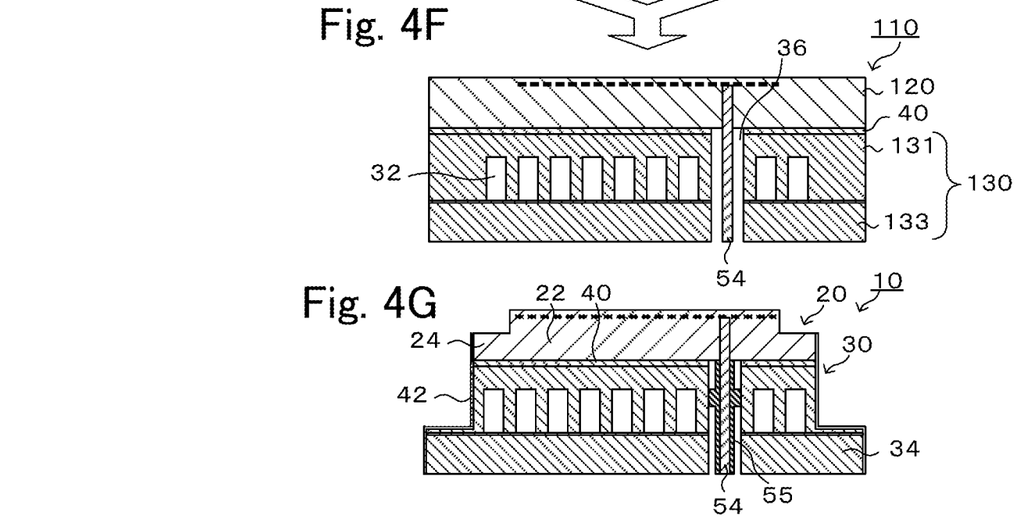

The bonded body 110 is such that the ceramic sintered body 120 is bonded to the upper surface of a circular block 130 from which the cooling substrate 30 is produced, with the metal bonding layer 40 interposed between the circular block 130 and the ceramic sintered body 120. The circular block 130 is a layered structure body such that the upper disk member 131 and the lower disk member 133 are bonded with a metal bonding layer interposed therebetween. The circular block 130 internally has the refrigerant flow path 32 and the power supply terminal hole 36. In addition, the power supply terminal 54 is stored in the power supply terminal hole 36.

TCB is performed, for example, in the following manner. Specifically, the layered body is pressurized and bonded at a temperature lower than or equal to the solidus temperature of the metal bonding material (for example, more than or equal to a temperature obtained by subtracting 20° C. from the solidus temperature and less than or equal to the solidus temperature), and subsequently, the temperature is returned to room temperature. Consequently, the metal bonding material becomes a metal bonding layer. As the metal bonding material in this case, an Al—Mg based bonding material and an Al—Si—Mg based bonding material may be used. For example, when TCB is performed using an Al—Si—Mg based bonding material, the layered body is pressurized in a state of heated in a vacuum atmosphere. A metal bonding material with a thickness of approximately 100 μm is preferably used.

Subsequently, the outer periphery of the ceramic sintered body 120 is ground to form a step, thus the ceramic substrate 20 including the central section 22 and the outer peripheral section 24 is produced. In addition, the outer periphery of the circular block 130 is ground to form a step, thus the cooling substrate 30 including the flange 34 is produced. In addition, the insulation pipe 55 is inserted through the lower opening of the power supply terminal hole 36. The power supply terminal 54 is inserted into the insulation pipe 55. The upper end of the insulation pipe 55 is bonded to the ceramic substrate 20. Furthermore, the insulating film 42 is formed by using ceramic powder to thermally spray the lateral surface of the outer peripheral section 24 of the ceramic substrate 20, the periphery of the metal bonding layer 40 and the lateral surface of the cooling substrate 30 (FIG. 4G). Consequently, the wafer placement table 10 is obtained.

Next, an example of use of the wafer placement table 10 will be described with reference to FIG. 1. As described above, the outer peripheral area of the wafer placement table 10 is fixed to the installation plate 96 of the chamber 94 by the clamping member 70. The upper end of the power supply rod 56 is in elastic contact with the lower surface of the power supply terminal 54. The seal rings 76, 77 are disposed between the installation plate 96 and the wafer placement table 10. Electrically insulative liquid is supplied to the refrigerant flow path 32 as a refrigerant. The refrigerant passes through the refrigerant flow path 32, and on the way also passes through the power supply terminal hole 36. On the ceiling surface of the chamber 94, a shower head 95 is disposed which injects a process gas through a large number of gas injection holes to the inside of the chamber 94. The installation plate 96 is composed of an insulating material such as alumina, for example.

The focus ring 12 is placed on the FR placement surface 24a of the wafer placement table 10, and a disk-shaped wafer W is placed on the wafer placement surface 22a. The focus ring 12 includes a step along the inner periphery of the upper end so as not to interfere with the wafer W. In this state, a DC voltage of the wafer attraction DC power supply 52 is applied to the wafer attraction electrode 26 to cause the wafer placement surface 22a to attract the wafer W. The inside of the chamber 94 is set to have a predetermined vacuum atmosphere (or a predetermined reduced pressure atmosphere), and an RF voltage from the RF power supply 62 is applied to the cooling substrate 30 while supplying a process gas from the shower head 95. Then a plasma is generated between the wafer W and the shower head 95. The plasma is utilized to perform CVD film formation or etching on the wafer W. Although the focus ring 12 is also worn out along with plasma treatment of the wafer W, the focus ring 12 is replaced after several wafers W are treated because the focus ring 12 is thicker than the wafer W.

When the wafer W is treated with a high-power plasma, it is necessary to cool the wafer W efficiently. In the wafer placement table 10, as the bonding layer between the ceramic substrate 20 and the cooling substrate 30, the metal bonding layer 40 having a high thermal conductivity is used instead of a resin layer having a low thermal conductivity. Thus, the capability to remove heat from the wafer W (heat removal capability) is high. In addition, the thermal expansion difference between the ceramic substrate 20 and the cooling substrate 30 is small, thus even when the stress relaxation performance of the metal bonding layer 40 is low, a problem is unlikely to occur.

In the wafer placement table 10 described above, the power supply terminal hole 36 intersects with the refrigerant flow path 32. Therefore, the refrigerant flow path 32 does not need to be provided so as to avoid the power supply terminal hole 36. Therefore, temperature singularity is prevented from occurring at the portion of the wafer W, immediately above the power supply terminal hole 36.

Also, electrically insulative liquid is supplied to the refrigerant flow path 32 as a refrigerant. Thus, the power supply terminal 54 and the cooling substrate 30 having electrical conductivity are insulated by the electrically insulative liquid.

Furthermore, in the power supply terminal hole 36, the insulation pipe 55 is disposed to support the power supply terminal 54 by allowing the power supply terminal 54 to pass through the insulation pipe 55. Since the power supply terminal 54 is supported by the insulation pipe 55, the power supply terminal 54 can be prevented from being pressed and damaged by the flow of refrigerant. In addition, the voltage resistance across the cooling substrate 30 and the power supply terminal 54 can be increased.

Furthermore, the upper end of the insulation pipe 55 is fixed to the ceramic substrate 20, and the lateral surface of the insulation pipe 55 is provided with the convex section 55a which is in contact with the inner wall of the power supply terminal hole 36. Thus, the convex section 55a can regulate the movement of the insulation pipe 55 supporting the power supply terminal 54 with in the power supply terminal hole 36. Thus, the power supply terminal 54 can be prevented from being pressed and damaged by the flow of refrigerant reliably. Note that the convex section 55a may be disposed close to the inner wall of the power supply terminal hole 36 without being in contact therewith.

The present invention is not limited to the above-described embodiment, and can be carried out by various modes as long as they belong to the technical scope of the invention.

Figure 5:
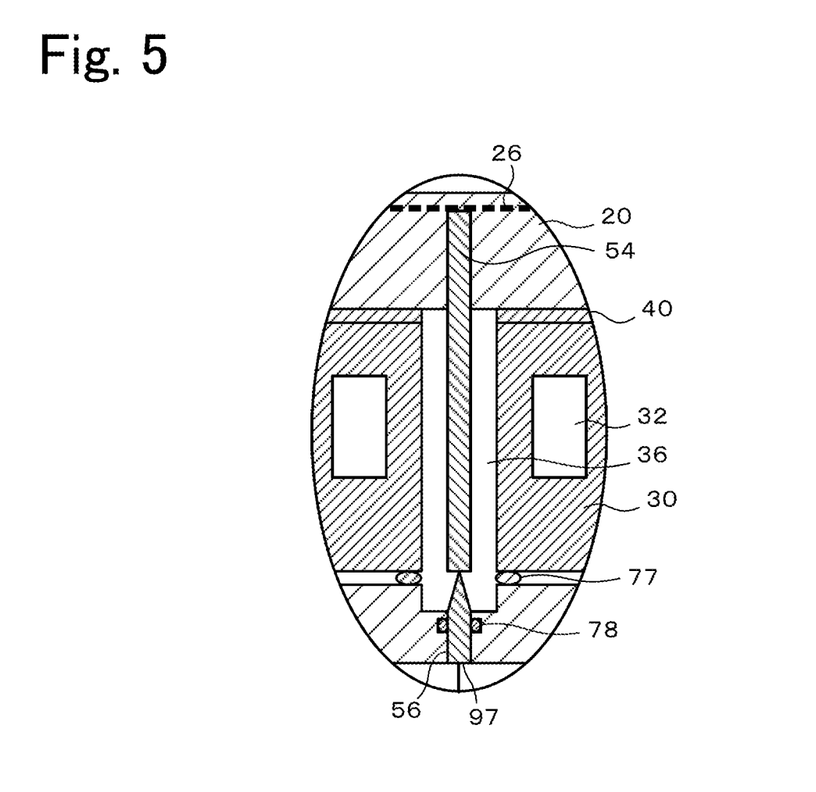
FIG. 5 is an enlarged cross-sectional view illustrating the vicinity of the power supply terminal hole 36 with an insulation pipe 55 omitted.

In the embodiment described above, in the power supply terminal hole 36, the insulation pipe 55 is disposed to support the power supply terminal 54 by allowing the power supply terminal 54 to pass through the insulation pipe 55; however, the insulation pipe 55 may be omitted as illustrated in FIG. 5. Even in this way, the power supply terminal 54 and the cooling substrate 30 having electrical conductivity are insulated by electrically insulative liquid.

In the embodiment described above, the insulation pipe 55 having the convex section 55a on the lateral surface is used; however, the insulation pipe 55 having no convex section 55a on the lateral surface may be used. Even in this way, the power supply terminal 54 is supported by the insulation pipe 55, thus the power supply terminal 54 can be prevented from being pressed and damaged by the flow of refrigerant.

Figure 6:
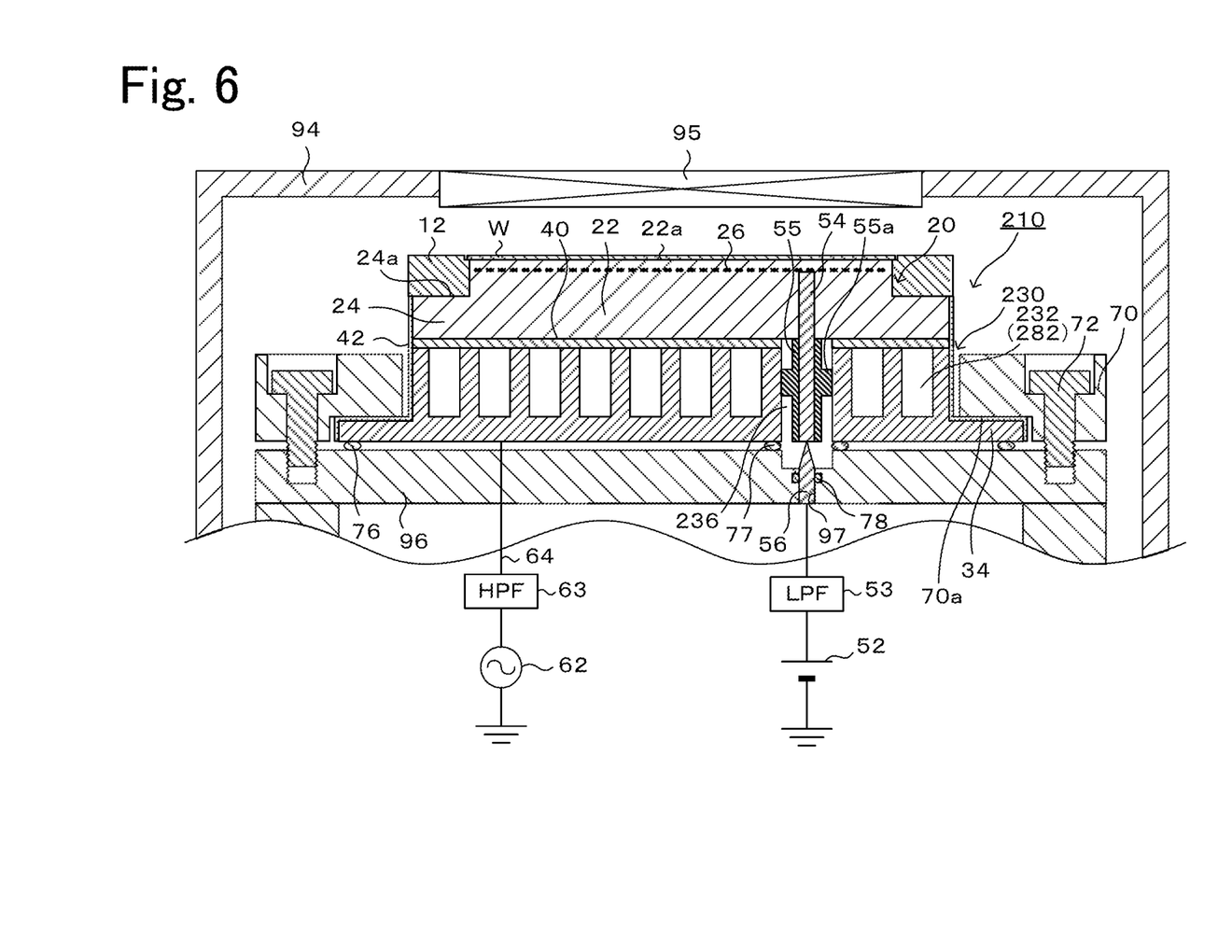
FIG. 6 is a vertical cross-sectional view of a wafer placement table 210.

In the embodiment described above, as illustrated in FIGS. 4A to 4G, the cooling substrate 30 has a layered structure in which the two disk members 131, 133 are bonded. However, without being particularly limited to this, for example, as in the wafer placement table 210 illustrated in FIG. 6, a cooling substrate 230 with a single-layered structure may be used. In FIG. 6, the same components as in the above-described embodiment are labeled with the same symbol. The cooling substrate 230 has a refrigerant flow path groove 282 opened in the upper surface. The refrigerant flow path 232 is formed by covering the upper opening of the refrigerant flow path groove 282 with the metal bonding layer 40. A power supply terminal hole 236 is provided inside the refrigerant flow path 232 (the refrigerant flow path groove 282). When the wafer placement table 210 is manufactured, the refrigerant flow path groove 282 and the power supply terminal hole 236 are formed in one disk member, and subsequently, the ceramic substrate 20 may be bonded to the disk member by TCB using a metal bonding material. Since the cooling substrate 230 has a single-layered structure, the manufacturing cost (material cost and production cost) of the cooling substrate 230 can be reduced as compared to a layered structure.

Figure 7:
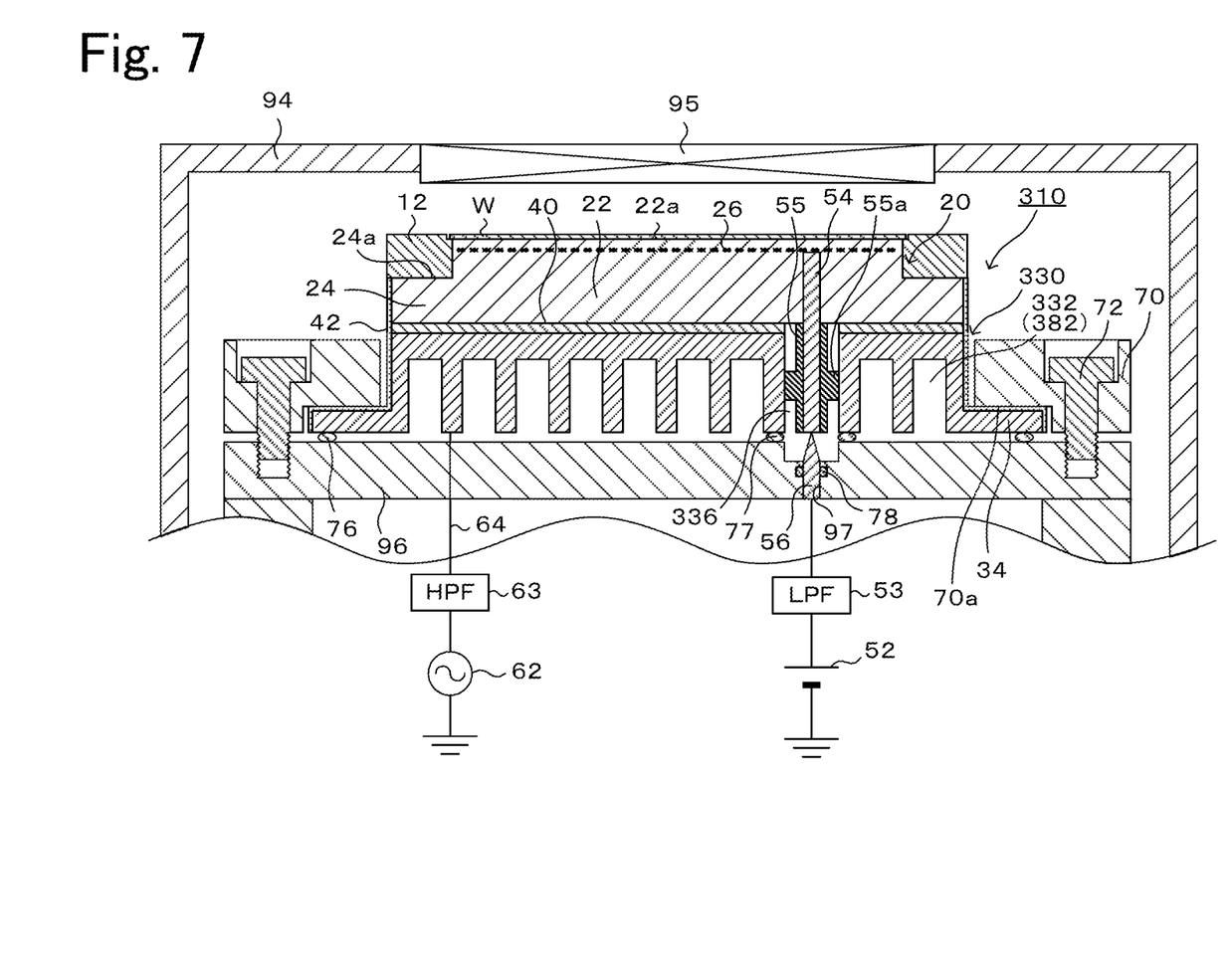
FIG. 7 is a vertical cross-sectional view of a wafer placement table 310.

Alternatively, as in the wafer placement table 310 illustrated in FIG. 7, a cooling substrate 330 with a single-layered structure may be used. In FIG. 7, the same components as in the above-described embodiment are labeled with the same symbol. The cooling substrate 330 has a refrigerant flow path groove 382 opened in the lower surface. A refrigerant flow path 332 is formed by covering the lower opening of the refrigerant flow path groove 382 with the installation plate 96 and the seal ring 76. Note that the seal ring 77 may be omitted. A power supply terminal hole 336 is provided inside the refrigerant flow path 332 (refrigerant flow path groove 382). When the wafer placement table 310 is manufactured, the refrigerant flow path groove 382 and the power supply terminal hole 336 are formed in one disk member, and subsequently, the ceramic substrate 20 may be bonded to the disk member by TCB using a metal bonding material. Since the cooling substrate 330 has a single-layered structure, the manufacturing cost (material cost and production cost) of the cooling substrate 330 can be reduced as compared to a layered structure. Note that a sealing member to divide adjacent portions of the refrigerant flow path groove 382 may be disposed between the lower surface of the cooling substrate 330 and the upper surface of the installation plate 96.

In the embodiment described above, as illustrated in FIG. 2, the power supply terminal hole 36 is provided between the one end (inlet) and the other end (outlet) of the refrigerant flow path 32; however, the power supply terminal hole 36 may be provided at the one or the other end of the refrigerant flow path 32.

Figure 8:
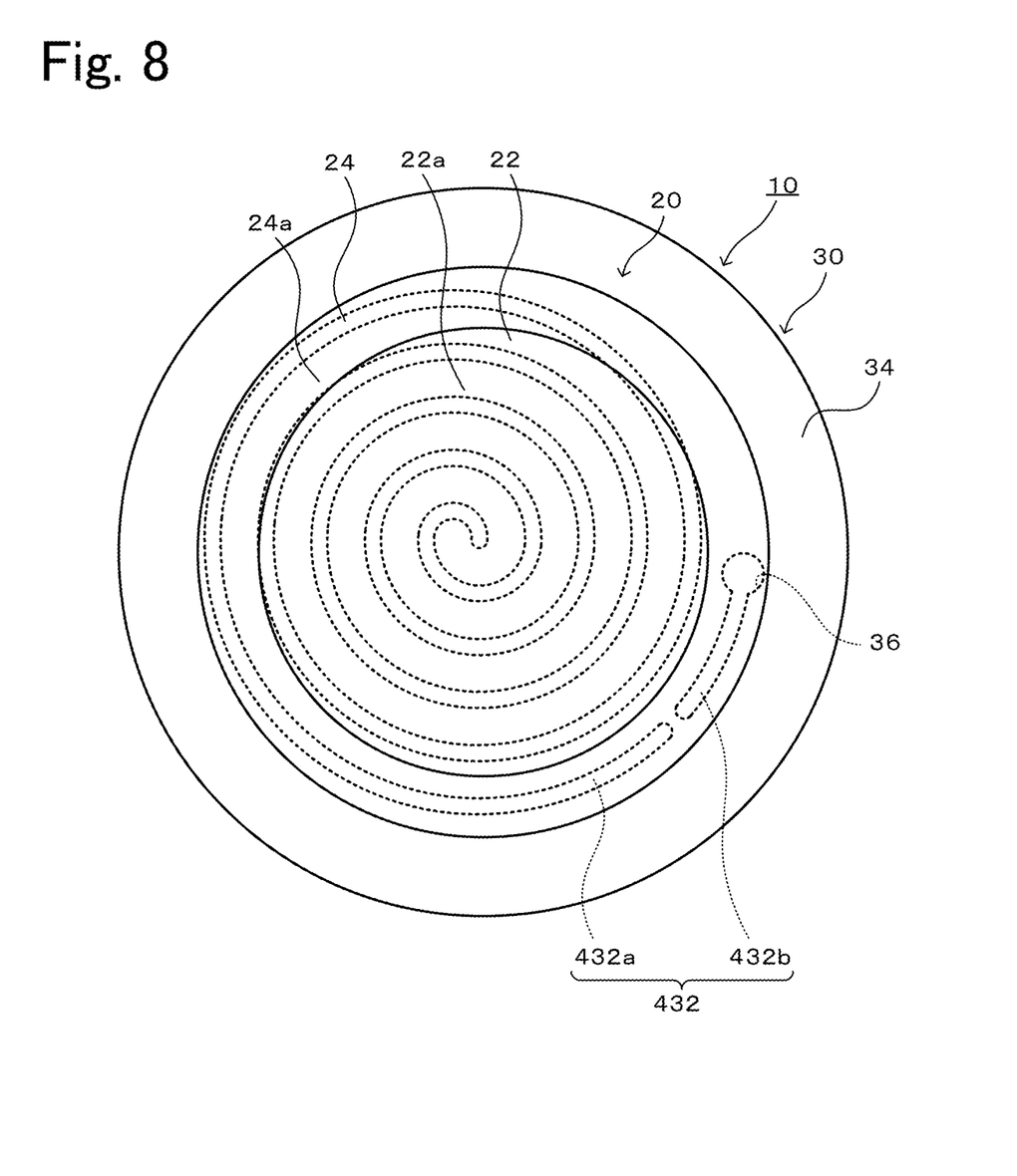
FIG. 8 is a plan view of another example of the wafer placement table 10.

In the embodiment described above, the refrigerant flow path 32 provided in the cooling substrate 30 has one line (one system). However, without being particularly limited to this, for example, the refrigerant flow path 32 may have two or more lines, and one line may be provided with the power supply terminal hole 36 to intersect with the line, and other lines may not be provided with the power supply terminal hole 36. An example thereof is illustrated in FIG. 8. FIG. 8 is a plan view of another example of the wafer placement table 10, and the same components as in the above-described embodiment are labeled with the same symbol. The refrigerant flow path 432 has a first line 432a and a second line 432b. The first line 432a and the second line 432b do not intersect with each other, and are provided from one end (inlet) to the other end (outlet) in a one-stroke pattern in a plan view respectively. Note that the one end (inlet) and the other end (outlet) are provided at different positions in a plan view. The refrigerant is individually supplied and discharged to and from the first line 432a and the second line 432b. Although the second line 432b is provided with the power supply terminal hole 36, the first line 432a is not provided with the power supply terminal hole 36. When the power supply terminal hole 36 is provided at the second line 432b, as illustrated in FIG. 8, the power supply terminal hole 36 may be provided at one end (or the other end) of the second line 432b, or provided between the one end and the other end of the second line 432b. Alternatively, the second line 432b may not be provided with the power supply terminal hole 36, and the first line 432a may be provided with the power supply terminal hole 36. Alternatively, when a plurality of power supply terminals are present, and each of the plurality of power supply terminals is individually stored in a power supply terminal hole, part of the plurality of power supply terminals may be provided in the first line 432a, and the remaining part may be provided in the second line 432b. Alternatively, a line is provided for each power supply terminal hole 36, and a refrigerant may be individually supplied and discharged to and from each line.

In the embodiment described above, a hole may be provided which penetrates the wafer placement table 10 from the lower surface of the cooling substrate 30 to the wafer placement surface 22a. As such a hole, a gas supply hole for supplying a thermally conductive gas (for example, He gas) to the back surface of the wafer W, and a lift pin hole for inserting a lift pin to lift or lower the wafer W with respect to the wafer placement surface 22a may be mentioned. The thermally conductive gas is supplied to the space formed by the wafer W and a large number of small protrusions (to support the wafer W) which are provided on the wafer placement surface 22a and not illustrated. For example, when the wafer W is supported by three lift pins, lift pin holes are provided at three sites.

In the embodiment described above, the cooling substrate 30 is produced with a brittle conductive material; however, the cooling substrate 30 may be produced with another brittle material (for example, an alumina material). Alternatively, the cooling substrate 30 may be produced with metal such as aluminum or aluminum alloy.

In the embodiment described above, the wafer attraction electrode 26 is incorporated in the central section 22 of the ceramic substrate 20; however, instead of or in addition to this, an RF electrode for plasma generation may be incorporated, or a heater electrode (resistance heating element) may be incorporated. The wafer attraction electrode 26 may be used along with an RF electrode. In addition, a focus ring (FR) attraction electrode may be incorporated, or an RF electrode or a heater electrode may be incorporated in the outer peripheral section 24 of the ceramic substrate 20.

In the embodiment described above, the ceramic sintered body 120 of FIG. 4A is produced by hot-press firing of a molded body of ceramic powder, and the molded body may be produced by layering multiple tape molded bodies, or produced by a mold cast method, or produced by compacting ceramic powder.

In the embodiment described above, the ceramic substrate 20 and the cooling substrate 30 are bonded by the metal bonding layer 40; however, a resin bonding layer may be used instead of the metal bonding layer 40.

The application claims the benefit of Japanese Patent Application No. 2022-072511 filed Apr. 26, 2022, which is hereby incorporated by reference herein in its entirety.

What is claimed is:
1. A wafer placement table comprising:
a ceramic substrate having a wafer placement surface at an upper surface, and incorporating an electrode;
a cooling substrate which is bonded to a lower surface of the ceramic substrate, and in which a refrigerant flow path is formed;
a power supply terminal connected to the electrode; and
a power supply terminal hole vertically penetrating the cooling substrate and storing the power supply terminal,
wherein the power supply terminal hole intersects with the refrigerant flow path.
2. The wafer placement table according to claim 1, wherein electrically insulative liquid is supplied to the refrigerant flow path.

3. The wafer placement table according to claim 1,
wherein in the power supply terminal hole, an insulation pipe is disposed to support the power supply terminal by allowing the power supply terminal to pass through the insulation pipe.

4. The wafer placement table according to claim 3,
wherein an upper end of the insulation pipe is fixed to the ceramic substrate, and
a lateral surface of the insulation pipe has a convex section which is in contact with or disposed close to an inner wall of the power supply terminal hole.

5. The wafer placement table according to claim 1,
wherein the cooling substrate has a single-layered structure.

6. The wafer placement table according to claim 5,
wherein the refrigerant flow path has a refrigerant flow path groove provided in an upper surface or a lower surface of the cooling substrate.

7. The wafer placement table according to claim 1,
wherein the refrigerant flow path includes a plurality of lines each provided from one end to the other end in a one-stroke pattern in a plan view, and
the power supply terminal hole is provided in one or more of the plurality of lines.

* * * * *